United States Patent
Lee et al.

(10) Patent No.: US 10,139,067 B2
(45) Date of Patent: Nov. 27, 2018

(54) LASER CAR LAMP

(71) Applicant: National Taiwan University of Science and Technology, Taipei (TW)

(72) Inventors: Tsung-Xian Lee, Taipei (TW); Ching-Chia Chou, Taipei (TW); Kuei-Chun Liu, Taipei (TW)

(73) Assignee: NATIONAL TAIWAN UNIVERSITY OF SCIENCE AND TECHNOLOGY, Taipei (TW)

( * ) Notice: Subject to any disclaimer, the term of this patent is extended or adjusted under 35 U.S.C. 154(b) by 1 day.

(21) Appl. No.: 15/472,258

(22) Filed: Mar. 28, 2017

(65) Prior Publication Data

US 2018/0106451 A1  Apr. 19, 2018

(30) Foreign Application Priority Data

Oct. 13, 2016 (TW) .............................. 105133126 A

(51) Int. Cl.
| | |
|---|---|
| *F21V 11/00* | (2015.01) |
| *F21S 41/24* | (2018.01) |
| *F21S 41/14* | (2018.01) |
| *F21S 45/47* | (2018.01) |
| *F21S 41/20* | (2018.01) |
| *H01S 5/40* | (2006.01) |

(Continued)

(52) U.S. Cl.
CPC .............. *F21S 41/24* (2018.01); *F21S 41/14* (2018.01); *F21S 41/285* (2018.01); *F21S 45/47* (2018.01); *H01S 5/0228* (2013.01); *H01S 5/02252* (2013.01); *H01S 5/4025* (2013.01); *F21Y 2115/30* (2016.08); *H01S 5/005* (2013.01); *H01S 5/4012* (2013.01)

(58) Field of Classification Search
CPC .......... F21S 41/24; F21S 41/14; F21S 41/285; H01S 5/02252; H01S 5/4012; H01S 5/005; F21Y 2115/30
See application file for complete search history.

(56) References Cited

U.S. PATENT DOCUMENTS

| | | |
|---|---|---|
| 4,707,595 A | 11/1987 | Meyers |
| 9,377,169 B2 | 6/2016 | Suckling et al. |

(Continued)

FOREIGN PATENT DOCUMENTS

| | | |
|---|---|---|
| CN | 102121651 A | 7/2011 |
| CN | 104160208 A | 11/2014 |

(Continued)

OTHER PUBLICATIONS

K. A. Denault et al., "Efficient and stable laser-driven white lighting", AIP Advances 3, 072107 (2013), Jul. 10, 2013.

(Continued)

*Primary Examiner* — Evan Dzierzynski
(74) *Attorney, Agent, or Firm* — CKC & Partners Co., Ltd.

(57) ABSTRACT

A laser car lamp includes a plurality of laser diodes, at least one light guide element, a phosphor element, and a lens. The light guide element has a laser light incident surface and a laser light exit surface. The phosphor element is located adjacent to the laser light exit surface of the light guide element, and the lens is located adjacent to the laser light incident surface of the light guide element. In addition, the laser diodes are arranged around the laser light incident surface of the light guide element.

10 Claims, 10 Drawing Sheets

(51) Int. Cl.
*H01S 5/022* (2006.01)
*F21Y 115/30* (2016.01)
*H01S 5/00* (2006.01)

(56) References Cited

U.S. PATENT DOCUMENTS

| | | |
|---|---|---|
| 2009/0067194 A1 | 3/2009 | Sanchez |
| 2011/0148280 A1* | 6/2011 | Kishimoto .............. F21S 41/16 313/483 |
| 2013/0039029 A1 | 2/2013 | Wang et al. |
| 2013/0039058 A1* | 2/2013 | Yun .......................... F21V 3/00 362/235 |
| 2014/0078717 A1 | 3/2014 | Takahashi et al. |
| 2014/0168940 A1 | 6/2014 | Shiomi et al. |
| 2015/0362145 A1* | 12/2015 | Kai ..................... B60Q 1/0035 362/487 |

FOREIGN PATENT DOCUMENTS

| | | |
|---|---|---|
| TW | 200846699 A | 12/2008 |
| TW | I338637 B | 3/2011 |

OTHER PUBLICATIONS

C. Basu et al., "A High Power Blue Diode Laser Pumped White Light Source Using Remote Phosphors", ISAL 2013 Proceedings, Sep. 24, 2013.

U. Hartwig, "Fiber optic illumination by laser activated remote phosphor", Nonimaging Optics: Efficient Design for Illumination and Solar Concentration IX, Proc. of SPIE vol. 8485, Oct. 11, 2012.

T. X. Lee et al., "Novel remote phosphor design for laser based white lighting application", Fifteenth International Conference on Solid State Lighting and LED-based Illumination Systems, Proc. of SPIE vol. 9954, Sep. 2016.

\* cited by examiner

LASER CAR LAMP

RELATED APPLICATIONS

This application claims priority to Taiwan Application Serial Number 105133126, filed Oct. 13, 2016, which is herein incorporated by reference.

TECHNICAL FIELD

The present disclosure generally relates to a laser car lamp. More particularly, the present disclosure relates to a laser car headlamp.

BACKGROUND

With the increasing progress of science and technology, the brightness and quality of the car lamps are increasing day by day. The development of the car lamps starts from kerosene car lamps, and then progresses to halogen car lamps, xenon car lamps, light emitting diode car lamps, and laser car lamps.

Light emitting diode lamps are widely used in lighting applications to provide a higher efficiency and a longer lifespan compared with the conventional incandescent or fluorescent tubes. However, in the high-power automotive lighting application, Light emitting diode lamp still has many bottlenecks and limitations.

Laser diodes can withstand higher currents and have a smaller volume, and thus can provide higher brightness and better lighting quality compared with light emitting diodes. Therefore, the laser car lamps having the faster response, lower brightness attenuation, smaller volume, lower energy consumption, long lifespan and other advantages, are better than the LED lights in many ways.

However, while a laser beam generated by the laser diode is emitted directly out of the vehicle, the laser beam may cause harmful results and therefore has to be carefully considered in use. Accordingly, there is a need to provide an efficient and safe laser car lamp, not only able to protect the user but also able to improve the safety of traffic.

SUMMARY

One objective of the embodiments of the present invention is to provide a laser car lamp able to dynamically adjust a projection distance and a light pattern thereof and avoid the danger caused by the laser car lamp.

To achieve these and other advantages and in accordance with the objective of the embodiments of the present invention, as the embodiment broadly describes herein, the embodiments of the present invention provides a laser car lamp including a plurality of laser diodes, at least one light guide element having a laser light incident surface and a laser light exit surface, a phosphor element disposed at one end, adjacent to the laser light exit surface, of the light guide element, a lens disposed at another end, adjacent to the laser light incident surface, of the light guide element. The laser diodes are annularly arranged on the another end, adjacent to the laser light incident surface, of the light guide element.

In one or more embodiments, the laser light incident surface faces the outside of the laser car lamp, and the laser light exit surface faces the inside of the laser car lamp. In one or more embodiments, the laser light incident surface faces a front side of a car, and the laser light exit surface faces a rear side of the car.

In one or more embodiments, the at least one light guide element further includes a first light guide element and a second light guide element to respectively fulfill a high beam illumination requirement and a low beam illumination requirement.

In one or more embodiments, the second light guide element further comprises a first guide portion and a second guide portion to form an L-shaped light guide element.

In one or more embodiments, a portion of the laser diodes irradiates the first light guide element and another portion of the laser diodes irradiates the second light guide element.

In one or more embodiments, the at least one light guide element has a plurality of light guide elements to form a light guide element array, and the laser diodes respectively irradiate corresponding light guide element.

In one or more embodiments, the laser diodes are arranged in a circular or a polygonal shape on the another end, adjacent to the laser light incident surface, of the light guide element.

In one or more embodiments, the phosphor element comprises a phosphor layer and a reflective layer.

In one or more embodiments, the laser light incident surface comprises a vertical incident surface, an inclined incident surface, a horizontal incident surface, a curved incident surface, an oblique incident surface or a combination thereof.

In one or more embodiments, the laser diodes are disposed on a surface of the light guide element, and a rear side of the phosphor element is further equipped with a heat dissipating device, e.g. a heat dissipating fin.

Accordingly, the laser car lamp according to the present invention utilizes a plurality of laser diodes annularly, e.g. circularly or polygonally, arranged on the laser light incident surface of the light guide element to provide a laser light source. The laser car lamp according to the present invention can produce a required light pattern by respectively turning on the required laser diodes to irradiate corresponding light guide elements. Since the laser beam of the laser car lamp disclosed in the present invention is incident to the light guide element to excite the phosphor and is directed toward the inside of the vehicle, generally toward the rear side of the car. The laser beam, especially when the laser head lamp is damaged, will not irradiate outside of the car so as to effectively avoid harming others. In addition, the laser car lamp disclosed by the present invention can reduce the volume and complexity of the laser car lamp by the single optical axis.

BRIEF DESCRIPTION OF THE DRAWINGS

The foregoing aspects and many of the attendant advantages of this invention will be more readily appreciated as the same becomes better understood by reference to the following detailed description, when taken conjunction with the accompanying drawings, wherein.

DETAILED DESCRIPTION OF THE PREFERRED EMBODIMENT

The following description is of the best presently contemplated mode of carrying out the present disclosure. This description is not to be taken in a limiting sense but is made merely for the purpose of describing the general principles of the invention. The scope of the invention should be determined by referencing the appended claims.

Figure 1:
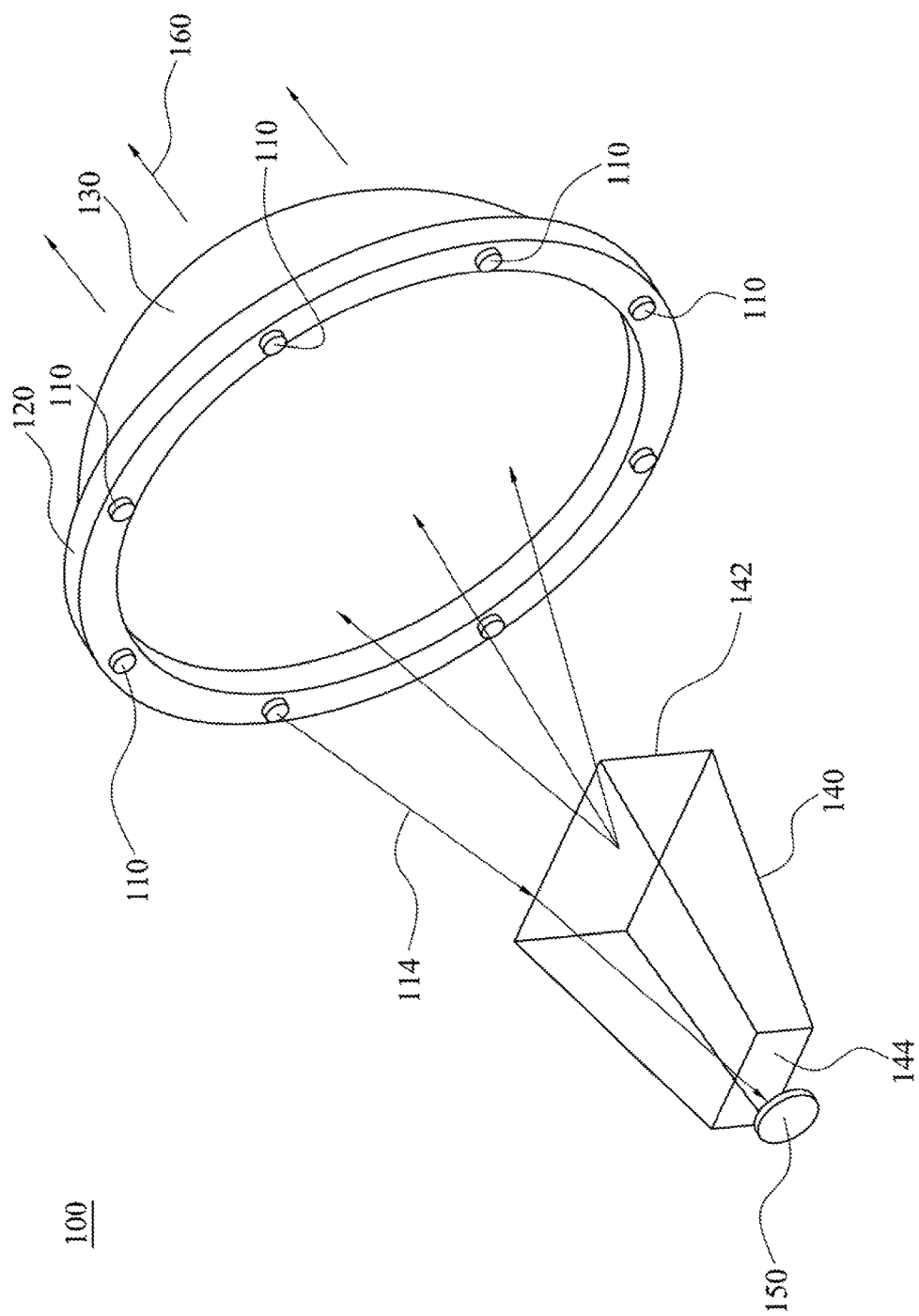
FIG. 1 illustrates a schematic view of a laser car lamp according to an embodiment of the present invention.

Refer to FIG. 1. FIG. 1 illustrates a schematic view of a laser car lamp according to an embodiment of the present invention. As depicted in FIG. 1, the laser car lamp 100 contains a light frame 120, a plurality of laser diodes 110 fixed on the light frame 120, a light guide element 140, a phosphor element 150 and a lens 130. A laser beam 114 generated by the laser diode 110 enters into the light guide element 140 through the laser light incident surface 142 of the light guide element 140 and emits out of the light guide element 140 through a laser light exit surface 144 of the light guide element 140 to excite a phosphor element 150 disposed on the laser light exit surface 144 so as to generate a required light, e.g. a white light, and the light is then directed through the light guide element 140 to the lens 130 to project a desired car lamp light 160. Accordingly, the laser light incident surface 142 of the light guide element 140 constitutes an output surface of a light source for the laser car lamp 100, and the laser light exit surface 144 of the light guide element 140 is able to receive the light generated by the phosphor element 150 that is excited by the laser beam 114 to form an input surface of the light source for the laser car lamp 100. Therefore, the present invention can effectively save the required volume of the laser car lamp 100 by simultaneously guiding the light excited by the laser beam and the laser beam itself with only one single optical axis. The light guide element 140 is, for example, a light guide element having a total internal reflection (TIR) characteristic.

The laser light incident surface 142 of the light guide element 140 is disposed adjacent to the lens 130, and the laser light exit surface 144 of the light guide element 140 is disposed adjacent to the phosphor element 150. That is to say, with a laser head lamp as an exemplary embodiment, the laser diode 110 emits a laser beam 114, guiding by the light guide element 140, from a front side of the laser car lamp 100 toward a rear side of the laser car lamp 100 to excite the phosphor element 150 at the rear side of the laser car lamp 100 to generate the desired white light, and the desired white light is then transmitted via the light guide element 140 to the lens 130, thereby emitting a desired car lamp light 160.

It is worth noting that the laser diodes 110 can be a monochromatic laser light source, such as blue laser diodes, or any other color laser diodes. The phosphor element 150 can be a yellow phosphor element or any other suitable phosphor element combined with corresponding laser diodes to generate a desired car lamp light 160 without departing from the spirit and scope of the present invention.

The plurality of laser diodes 110 can be mounted annularly on the light frame 120. Depending on the demand at the time of use, e.g. operating as the high beam lighting or the low beam lighting, a suitably positioned laser diodes 110 can be turned on to generate the laser beam 114 at a desired angle and position to excite the phosphor element 150 through the light guide element 140 and generate a desired light pattern of the car lamp light 160 to illuminate different areas and provide different brightness of the laser car lamp 100. The light frame 120 can be a circular light frame, a rectangular light frame, a quadrangle light frame, a trapezoidal light frame or a triangular light frame, all without departing from the spirit and scope of the present invention.

The plurality of laser diodes 110 can be disposed on the light frame 120, on the light guide element 140 or a round the lens, all without departing from the spirit and scope of the present invention.

Figure 2:
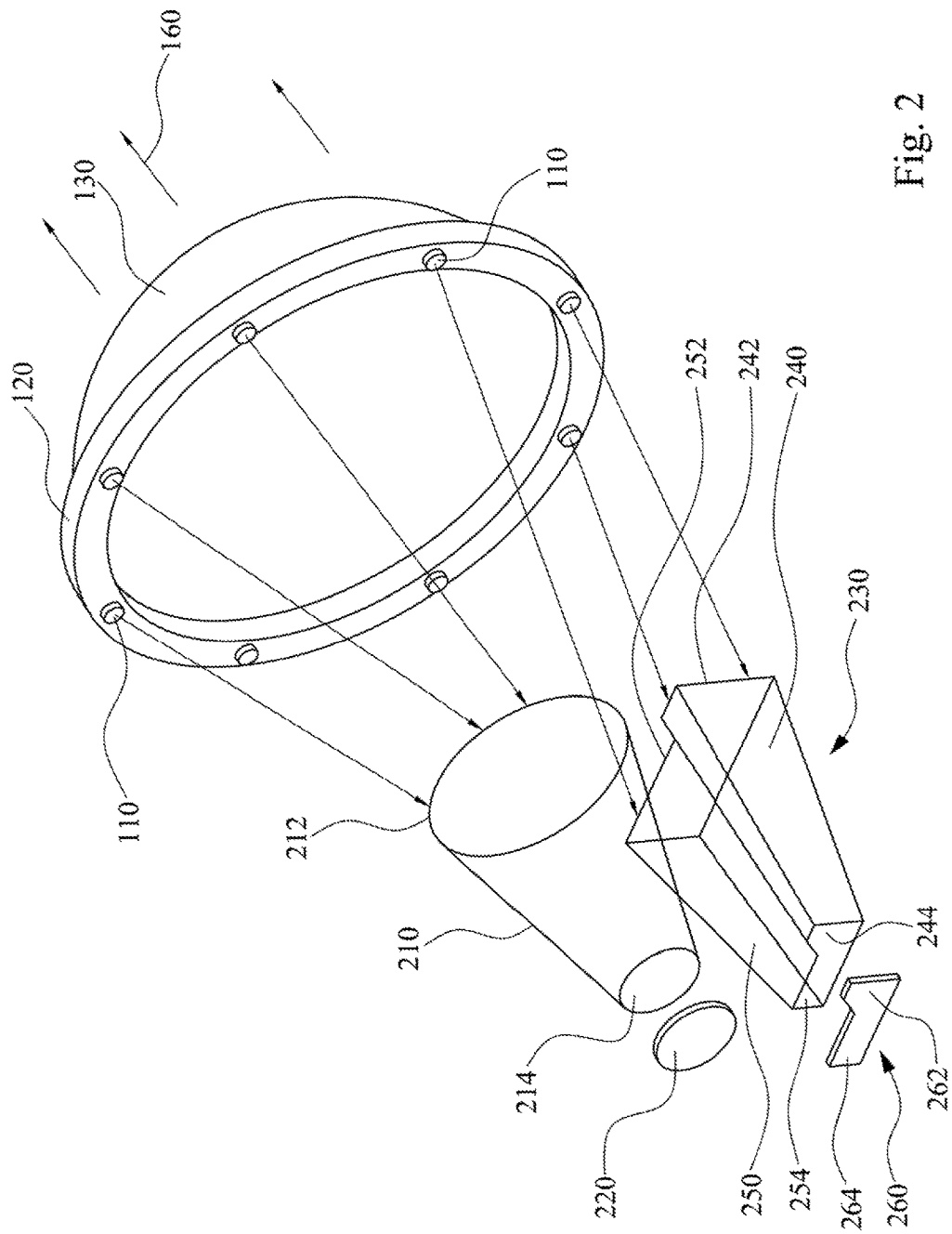
FIG. 2 illustrates a schematic view of a laser car lamp according to another embodiment of the present invention.

FIG. 2 illustrates a schematic view of a laser car lamp according to another embodiment of the present invention. The plurality of laser diodes 110, the light frame 120, and the lens 130 of the laser car lamp 100 are similar to those of the embodiment depicted in FIG. 1. The light guide element is divided into a first light guide element 210 and a second light guide element 230. The first light guide element 210 has a laser light incident surface 212 and a laser light exit surface 214, and the first phosphor element 220 is disposed adjacent to laser light exit surface 214. In one embodiment, the first light guide element 210 is formed as a conical shape, and generally fulfills, for example, a high beam illumination requirement. The laser beam generated by a part of the plurality of laser diodes 110 of the laser car lamp 100 enters into the first light guide element 210 and the laser beam generated by another part of the plurality of laser diodes 110 of the laser car lamp 100 enters into the second light guide element 230.

In one embodiment, the second light guide element 230, for example, fulfills a low beam illumination requirement. In comparison to the first light guide element 210, the second light guide element 230 fulfills a closer lighting requirement to reduce interference with vehicles coming in the opposite direction or pedestrians. The second light guide element 230 includes a first guide portion 240 and a second guide portion 250. Generally speaking, the second light guide element 230 can be, for example, an L-shaped light guide element to fulfill the national regulatory requirements and provide a suitable light pattern. The first guide portion 240 has a laser light incident surface 242 and a laser light exit surface 244, and the second guide portion 250 has a laser light incident surface 252 and a laser light exit surface 254.

The first guide portion 240 and the second guide portion 250 can be separately manufactured and separately mounted, or separately manufactured and then mounted together, or both may be formed by a single material, all without departing from the spirit and scope of the invention.

In addition, the phosphor element 260 includes a first phosphor portion 262 and a second phosphor portion 264 corresponding to the first guide portion 240 and the second guide portion 250. The first phosphor portion 262 and the second phosphor portion 264 can be adhered to the first guide portion 240 and the second guide portion 250, or spaced a desired distance apart from the first guide portion 240 and the second guide portion 250, all without departing from the spirit and scope of the present invention.

Figure 3:
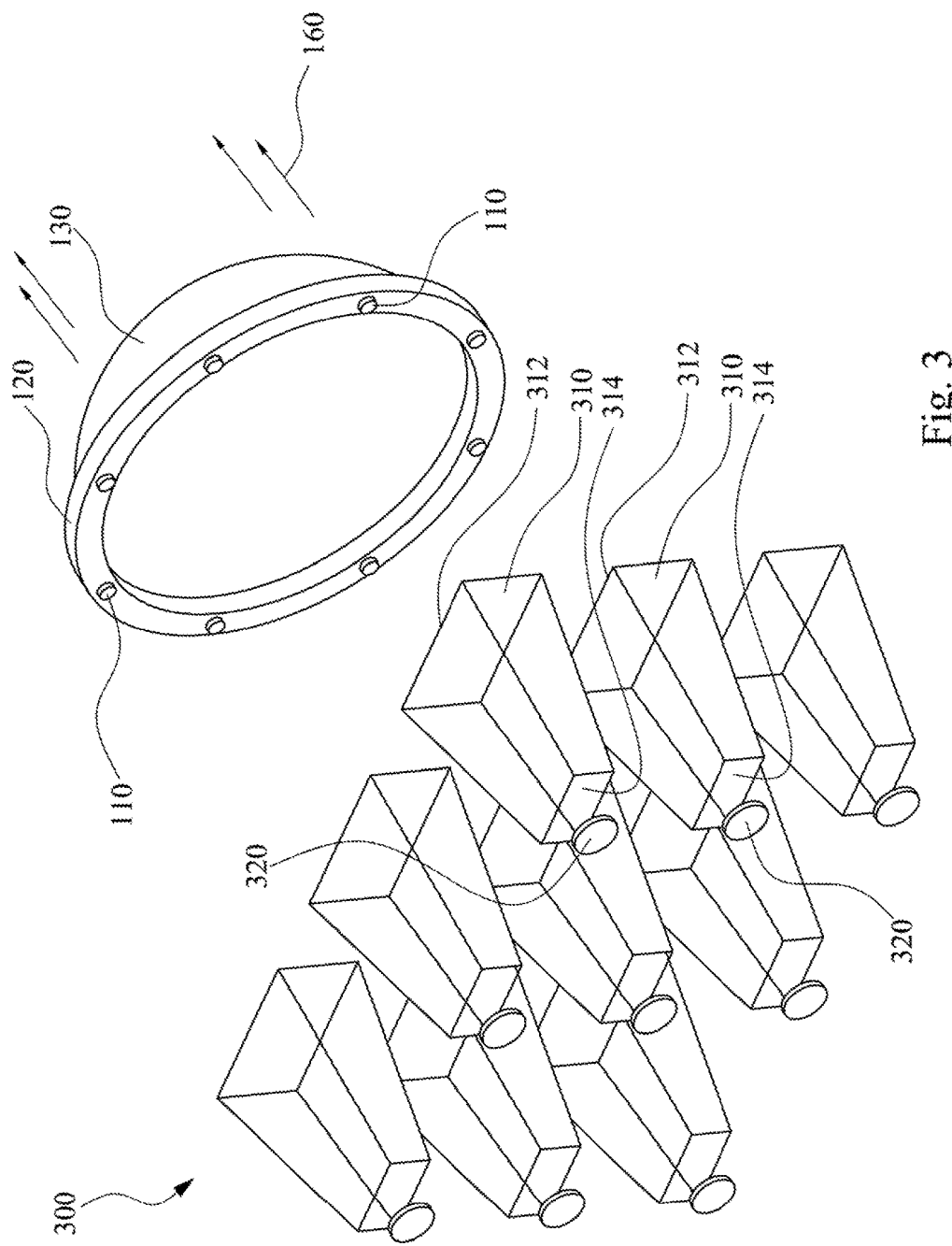
FIG. 3 illustrates a schematic view of a laser car lamp according to a further embodiment of the present invention.

FIG. 3 illustrates a schematic view of a laser car lamp according to a further embodiment of the present invention. As depicted in FIG. 3, the laser car lamp 100 includes a light guide element array 300 having a plurality of light guide elements 310 to form a light guide array module. The laser diodes 110 may be one-to-one, one-to-many or many-to-many light guide elements 310, and vice versa. Each of the light guide elements 310 includes a laser light incident surface 312 and a laser light exit surface 314, and the rear side of the light guide element 310, adjacent to the laser light exit surface 314, includes a phosphor element 320.

When the laser car lamp 100 works as a high beam lighting, the selected laser diodes 110 can emit laser beams to corresponding light guide elements 310 and the laser beams excite phosphor elements 320 to generate desired lights, and the desired lights are then condensed via lens 130 to project a desired light pattern of the car lamp light 160. Similarly, when the laser car lamp 100 works as a low beam lighting or any other different types of illumination devices, e.g. an intelligent lighting or a flashing warning lighting, the laser car lamp 100 can appropriately control the laser diodes 110 to provide the corresponding lighting or warning needs.

Figure 4B:
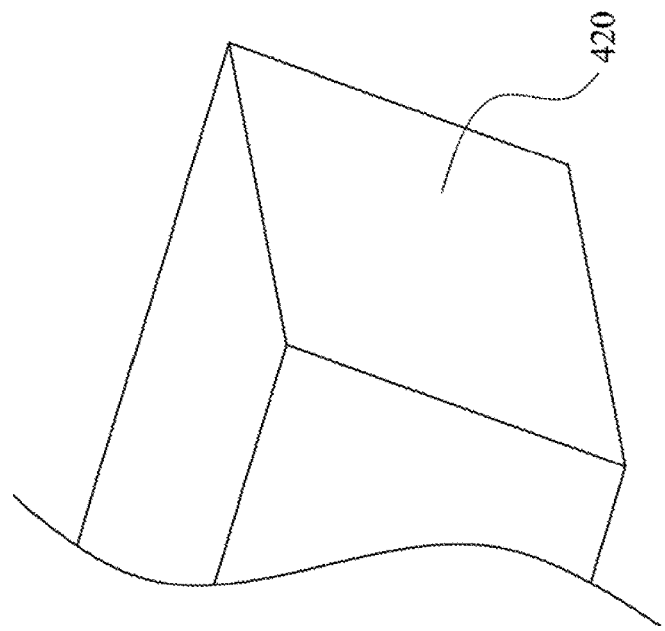
FIGS. 4A to 4F illustrate schematic views of laser light incident surfaces of light guide elements of laser car lamps in accordance with various embodiments of the present invention.
Figure 4A:
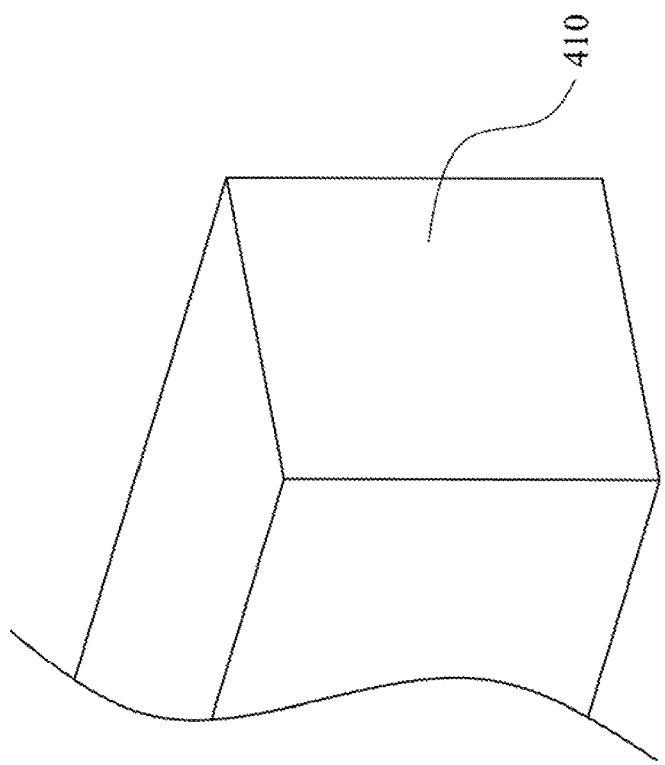
Figure 4D:
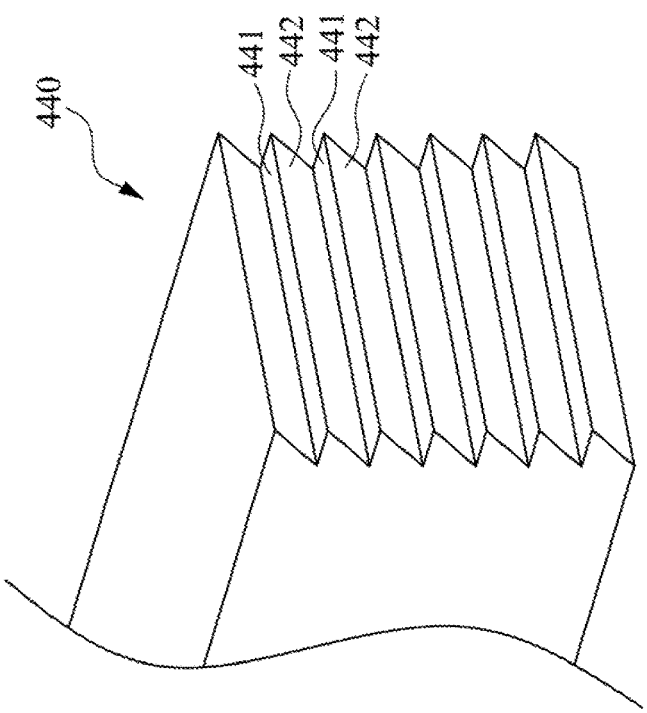
Figure 4C:
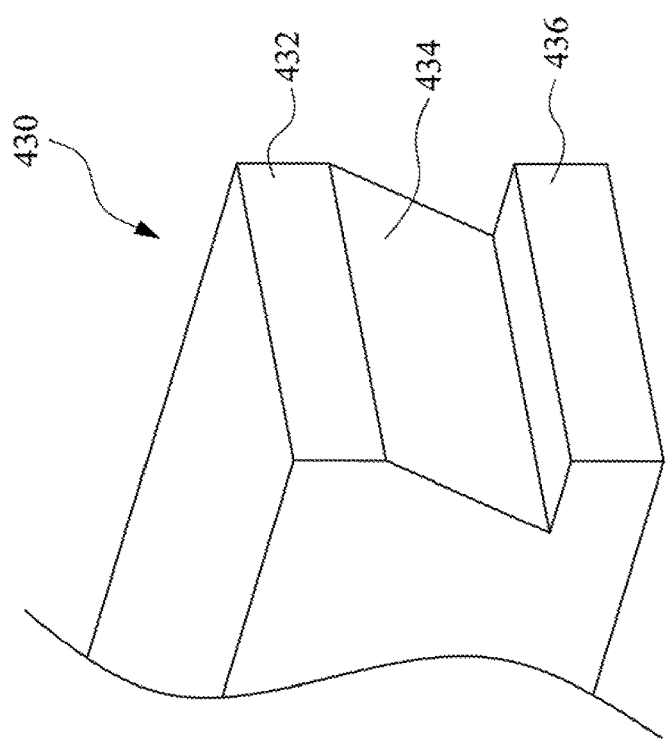
Figure 4F:
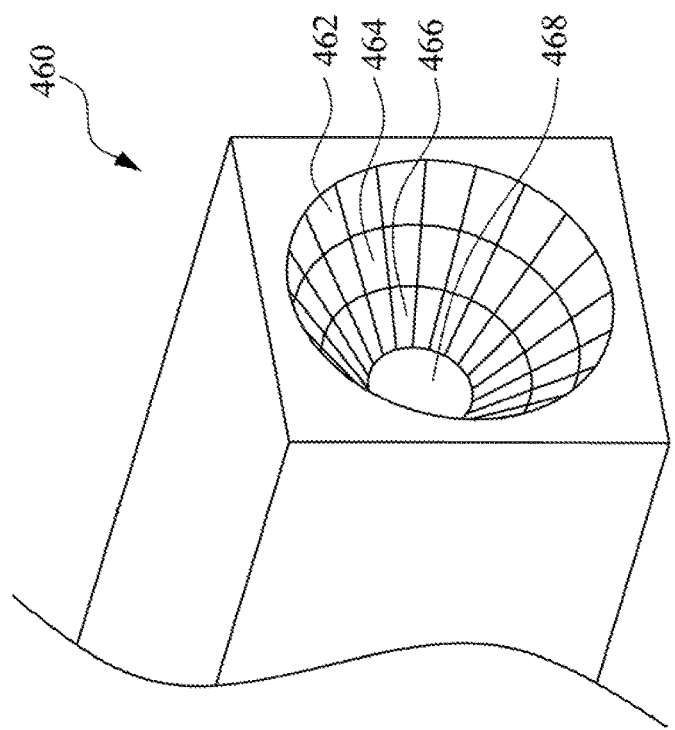
Figure 4E:
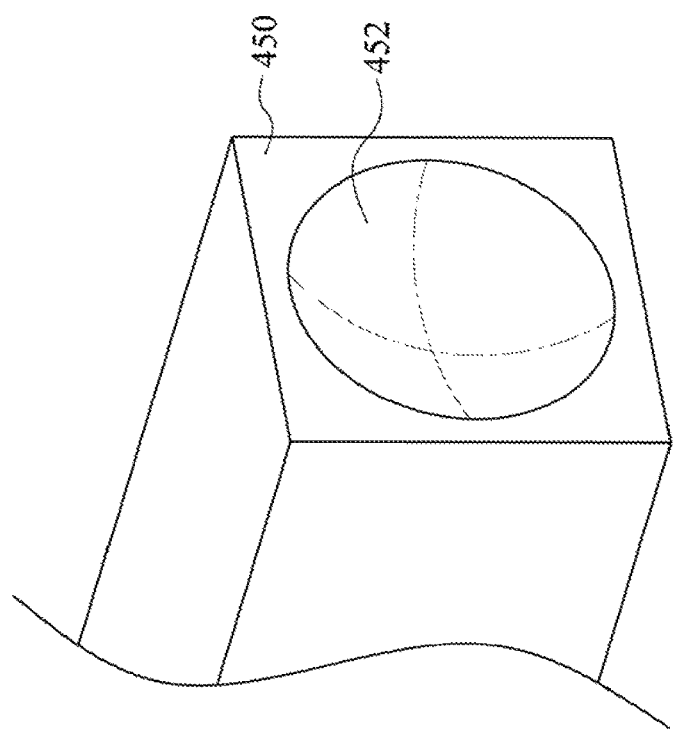

FIGS. 4A to 4F illustrate schematic views of laser light incident surfaces of light guide elements of laser car lamps in accordance with various embodiments of the present invention. As depicted in the various embodiments of the present invention, the laser light incident surface also works as an output surface for a light source of the laser car lamp. As depicted in FIG. 4A, the laser light incident surface 410 has a single incident surface, whereas the laser light incident surface 420 of FIG. 4B has a single inclined incident surface. The laser light incident surface 430 of FIG. 4C has a combined incident surface, e.g. a combination of a vertical incident surface 432, an inclined incident surface 434 and a vertical incident surface 436. The laser light incident surface 440 of FIG. 4D includes a plurality of horizontal incident surfaces 441 and a plurality of inclined incident surfaces 442. The laser light incident surface 450 of FIG. 4E includes a curved incident surface 452, for example, a partial spherical surface or a hemispherical incident surface. In general, the curved incident surface is formed in a recessed manner, and the curved surface is formed in a convex manner also without departing from the spirit and scope of the present invention. The laser light incident surface 460 of FIG. 4F is made by a plurality of inclined and curved surfaces, e.g. a plurality of first oblique incident surface 462, a plurality of second oblique incident surface 464, a plurality of third oblique incident surfaces 466, and a bottom incident surface 468. With the different types of the laser light incident surface, the laser beams can be distributed at different locations on the phosphor element to reduce the working temperature of the phosphor element, improve the phosphor element aging time, and effectively enhance the lifespan of the phosphor element.

Figure 5A:
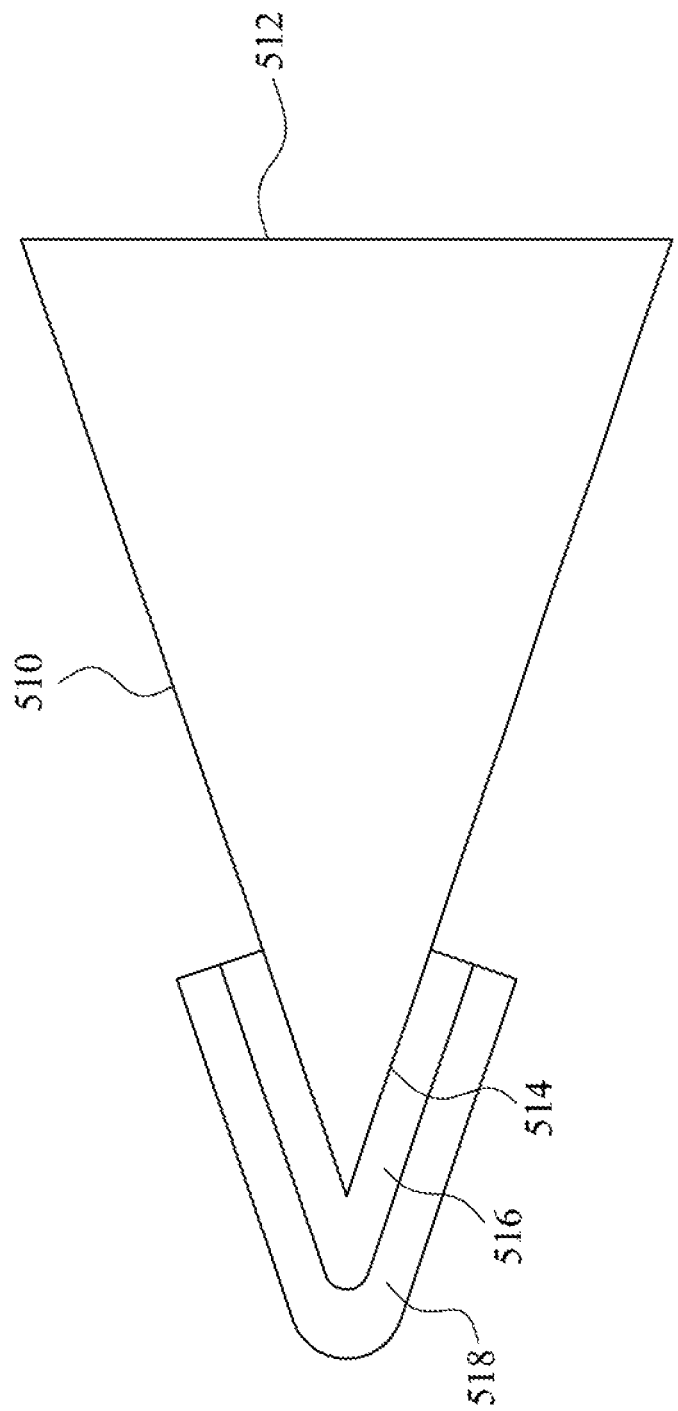
FIGS. 5A to 5C illustrate schematic views of light guide elements of laser car lamps in accordance with various embodiments of the present invention.
Figure 5B:
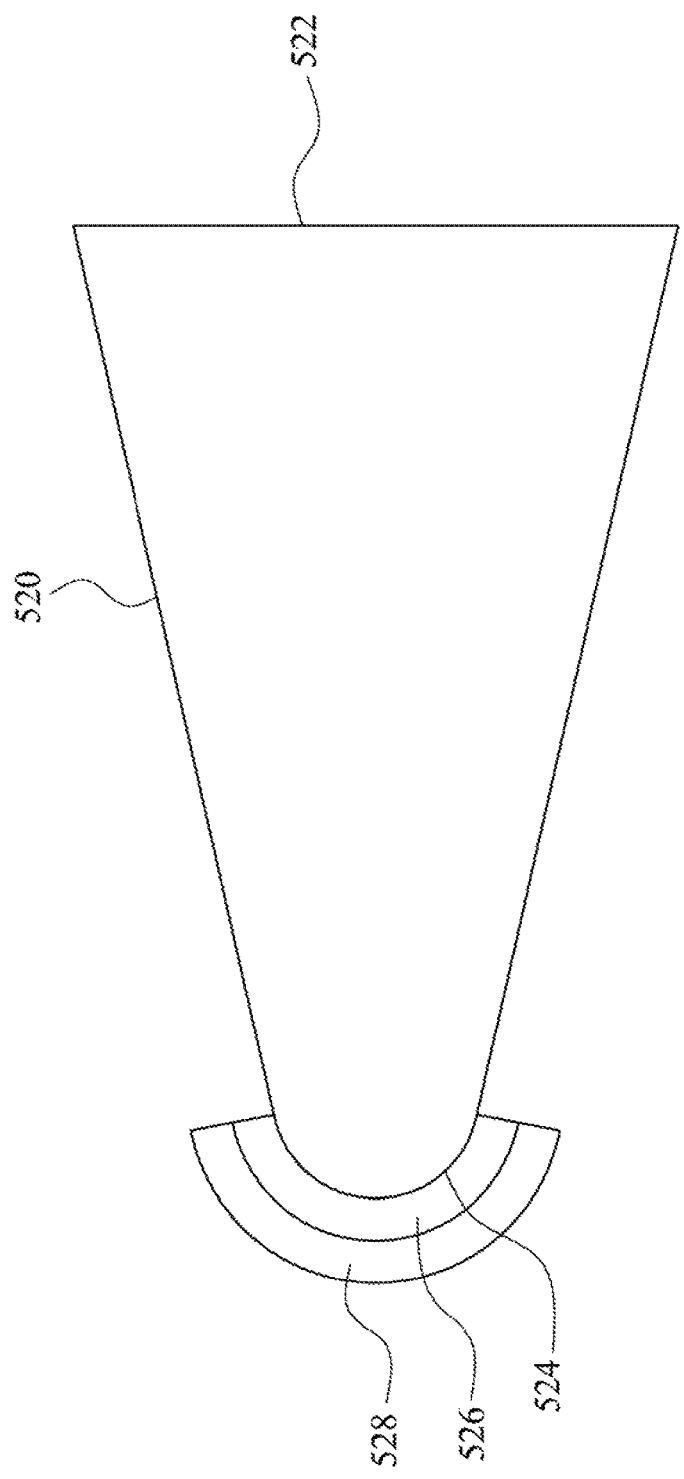
Figure 5C:
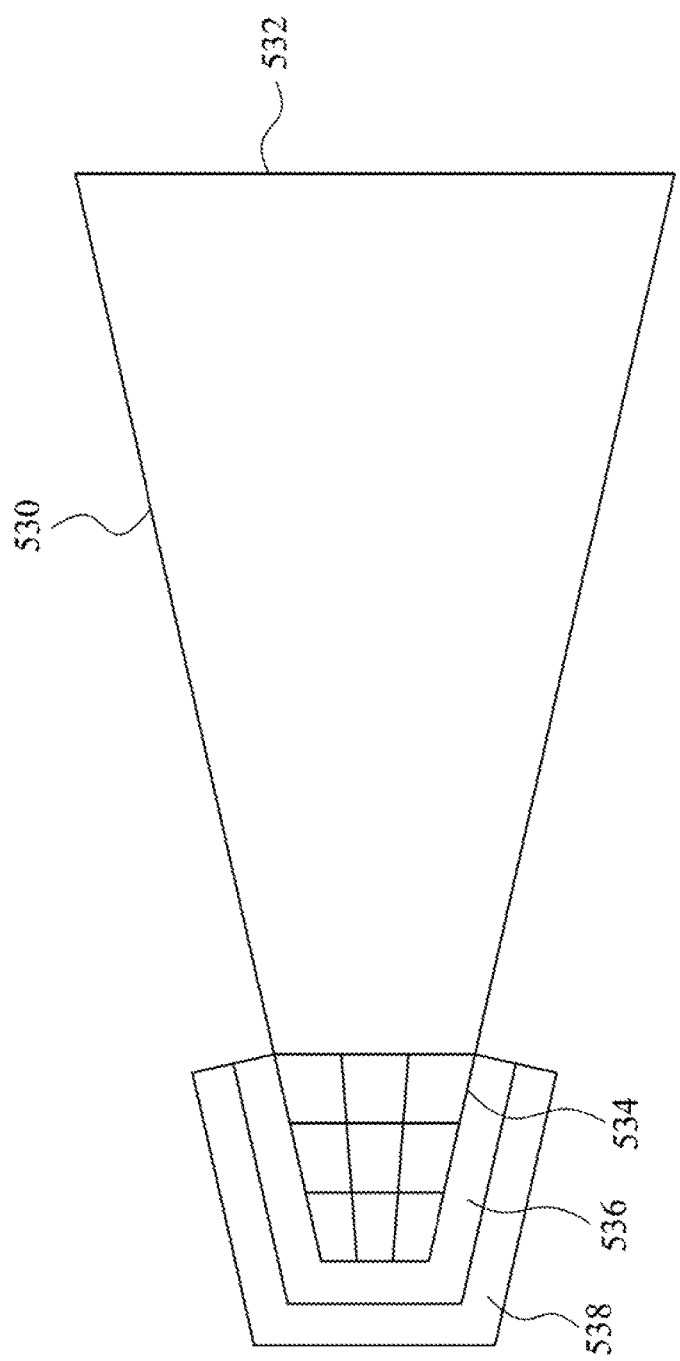

Refer to FIGS. 5A to 5C. FIGS. 5A to 5C illustrate schematic views of light guide elements of laser car lamps in accordance with various embodiments of the present invention. To further improve the efficiency of the laser car lamp 100, the light guide element and the phosphor element can be further integrated to effectively improve the efficiency of each light guide element, as well as the lifespan of the phosphor element is also improved.

Referring to FIG. 5A, FIG. 5A discloses that a light guide element 510 includes a laser light incident surface 512, a laser light exit surface 514, a phosphor layer 516 and a reflective layer 518. The phosphor layer 516 is located at one end of the light guide element 510, adjacent to the laser light exit surface 514, and is coated on the laser light exit surface 514 or spaced apart a distance from the laser light exit surface 514. The reflective layer 518 is formed behind the phosphor layer 516 to enhance the ability of reflecting the light to the lens for further increasing the efficiency of the laser car lamp 100. The phosphor layer 516 and the reflective layer 518 can constitute a styled phosphor element, such as a conical, triangular pyramid, or polygonal pyramid, or may be directly coated on the laser light exit surface 514, all without departing from the spirit and scope of the present invention. In addition, the laser light exit surface 514 can be a conical, triangular pyramid or polygonal pyramid without departing from the spirit and scope of the present invention.

Referring to FIG. 5B, FIG. 5B discloses that a light guide element 520 includes a laser light incident surface 522, a laser light exit surface 524, a phosphor layer 526 and a reflective layer 528. Similarly, the phosphor layer 526 may be located at one end, adjacent to a laser light exit surface 524, of the light guide element 520, coated on the laser light exit surface 524, or spaced apart a distance from the laser light exit surface 524. The reflective layer 528 is formed behind the phosphor layer 526 to enhance the ability of reflecting the light to the lens, and increase the efficiency of the laser car lamp 100. In addition, the phosphor layer 526 and the reflective layer 528 may constitute a styled phosphor element, e.g. a curved surface, a semicircle, or directly coated on the laser light exit surface 524, all without departing from the spirit and scope of the present invention. Furthermore, the laser light exit surface 524 can be a curved surface or a semi-circular surface without departing from the spirit and scope of the present invention.

Further refer to FIG. 5C. FIG. 5C discloses that a light guide element 530 includes a laser light incident surface 532, a laser light exit surface 534, a phosphor layer 536 and a reflective layer 538. Similarly, the phosphor layer 536 may be located at one end, adjacent to the laser light exit surface 534, of the light guide element 530 coated on the laser light exit surface 534, or spaced apart a distance from the laser light exit surface 534. The reflective layer 538 is formed behind the phosphor layer 536 to enhance the ability of reflecting the light to the lens, and further increase the efficiency of the laser car lamp 100. The phosphor layer 536 and the reflective layer 538 can constitute a styled phosphor element, e.g. a combination of a plurality of slopes or directly coated on the laser light exit surface 534, all without departing from the spirit and scope of the present invention. In addition, the laser light exit surface 534 can be a light exit surface formed by a plurality of inclined surfaces.

Figure 6:
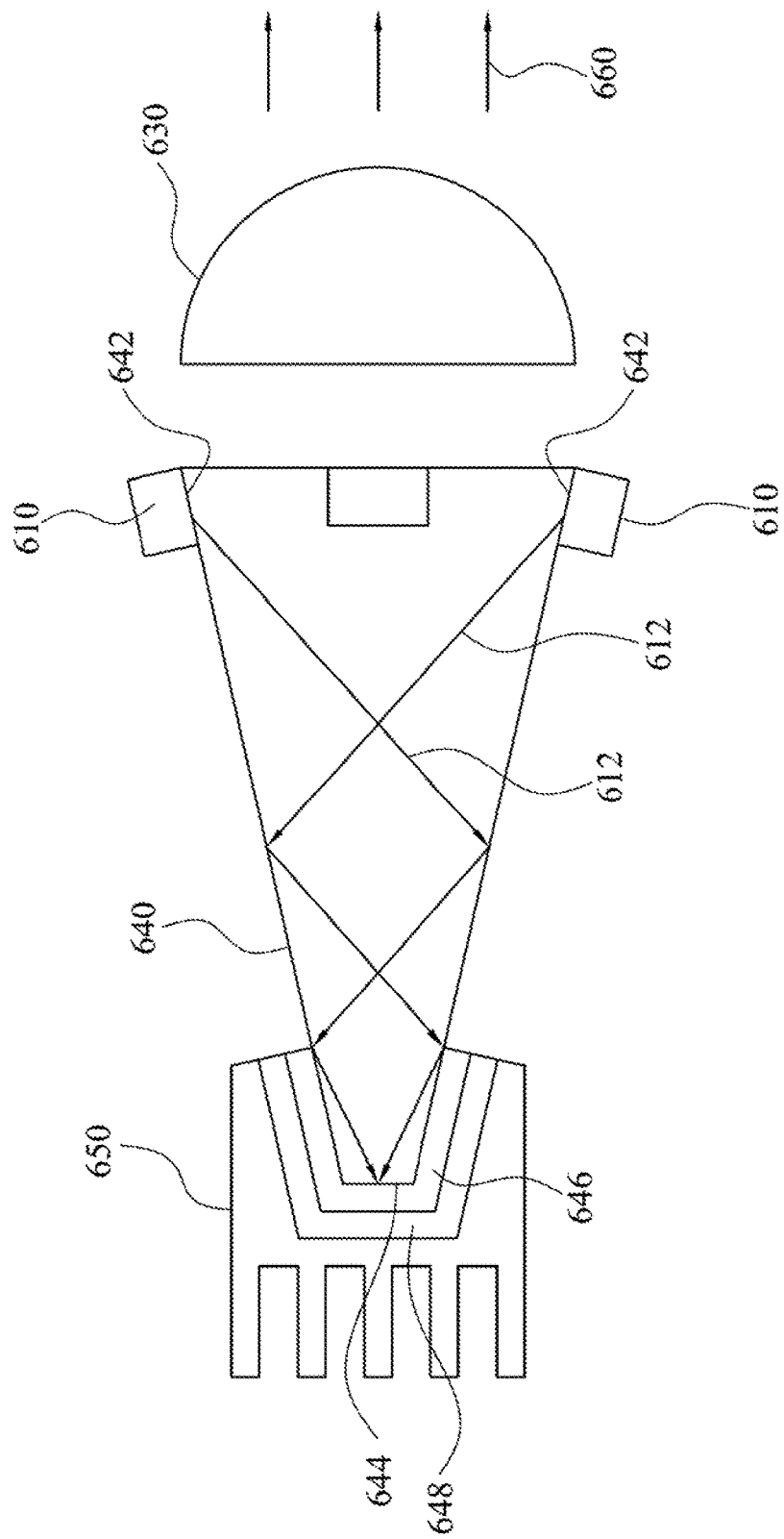
FIG. 6 illustrates a schematic view of a laser car lamp according to further another embodiment of the present invention.

FIG. 6 illustrates a schematic view of a laser car lamp according to further another embodiment of the present invention. As depicted in FIG. 6, a plurality of laser diodes 610 are annularly mounted on laser light incident surface 642 at one end of a light guide element 640, and another end of the light guide element 640 is provided with a laser light exit surface 644. The laser beams 612 generated by the laser diodes 610 are reflected in the light guide element 640 to a laser light exit surface 644, and then excite the phosphor layer 646 to provide a required light and the light further condense by the lens 630 to form the car lamp light 660. In addition, the phosphor layer 646 can further include a reflective layer 648 formed on the rear side thereof. Accordingly, the size of the laser car lamp 100 can be further narrowed down to allow a wider application range. In addition, a rear side of the reflective layer 648 can be further equipped with a heat dissipating device 650 to reduce the operating temperature of the phosphor layer 646, and the heat dissipating device 850 can be mounted directly behind the phosphor layer 646 without departing from the spirit and scope of the invention. The heat dissipating device 650 is, for example, a heat dissipating fin, and is not limited to this.

Accordingly, the laser car lamp disclosed by the present invention utilizes a plurality of laser diodes arranged annularly on the laser light incident surface of the light guide element to provide a laser light source. The laser car lamp according to the present invention can produce a required light pattern by respectively turning on the required laser diodes to irradiate corresponding light guide elements. Since the laser beam of the laser car lamp disclosed in the present invention is incident to the light guide element to excite the phosphor and is directed toward the inside of the vehicle, generally toward the rear side of the vehicle. The laser beam, especially when the laser head lamp is damaged, will not irradiate outside of the car so as to effectively avoid harming others. In addition, the laser car lamp disclosed by the present invention can reduce the volume and complexity of the laser car lamp by the single optical axis.

As is understood by a person skilled in the art, the foregoing preferred embodiments of the present invention are illustrative of the present invention rather than limiting of the present invention. It is intended that various modifications and similar arrangements be included within the spirit and scope of the appended claims, the scope of which should be accorded the broadest interpretation so as to encompass all such modifications and similar structures.

What is claimed is:

1. A laser car lamp, comprising:
a plurality of laser diodes;
at least one light guide element having a laser light incident surface and a laser light exit surface;
a phosphor element disposed at one end, adjacent to the laser light exit surface, of the light guide element; and
a lens disposed at another end, adjacent to the laser light incident surface, of the light guide element, wherein the laser diodes are annularly arranged on the another end, adjacent to the laser light incident surface, of the light guide element, wherein the laser diodes emits laser beams guiding by the light guide element from the laser light incident surface to the laser light exit surface so as to excite the phosphor element to generate a light, and the light generated by the phosphor element is transmitted via the light guide element to the lens.

2. The laser car lamp of claim 1, wherein the laser light incident surface faces an outside of the laser car lamp, and the laser light exit surface faces an inside of the laser car lamp.

3. The laser car lamp of claim 1, wherein the at least one light guide element further comprises a first light guide element and a second light guide element to respectively fulfill a high beam illumination requirement and a low beam illumination requirement.

4. The laser car lamp of claim 3, wherein the second light guide element further comprises a first guide portion and a second guide portion to form an L-shaped light guide element.

5. The laser car lamp of claim 4, wherein a portion of the laser diodes irradiates the first light guide element and another portion of the laser diodes irradiates the second light guide element.

6. The laser car lamp of claim 5, wherein the at least one light guide element has a plurality of light guide elements to form a light guide element array, and the laser diodes respectively irradiate corresponding light guide element.

7. The laser car lamp of claim 1, wherein the laser diodes are arranged in a circular or a polygonal shape on the another end, adjacent to the laser light incident surface, of the light guide element.

8. The laser car lamp of claim 1, wherein the phosphor element comprises a phosphor layer and a reflective layer.

9. The laser car lamp of claim 1, wherein the laser light incident surface comprises a vertical incident surface, an inclined incident surface, a horizontal incident surface, a curved incident surface, an oblique incident surface or a combination thereof.

10. The laser car lamp of claim 1, wherein the laser diodes are disposed on a surface of the light guide element, and a rear side of the phosphor element is further equipped with a heat dissipating device.

* * * * *